United States Patent
Abbott

(10) Patent No.: US 7,507,605 B2
(45) Date of Patent: Mar. 24, 2009

(54) LOW COST LEAD-FREE PREPLATED LEADFRAME HAVING IMPROVED ADHESION AND SOLDERABILITY

(75) Inventor: Donald C. Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 328 days.

(21) Appl. No.: 11/026,841

(22) Filed: Dec. 30, 2004

(65) Prior Publication Data

US 2006/0145311 A1 Jul. 6, 2006

(51) Int. Cl.
*H01L 21/00* (2006.01)

(52) U.S. Cl. ............... 438/123; 438/111; 438/121; 257/E23.054; 257/666; 257/668; 428/629

(58) Field of Classification Search .......... 257/E23.054, 257/E23.047, 666, 668, 670, 696, 677, 676, 257/712; 428/629, 675; 174/255; 438/111, 438/123, 124, 209, 121
See application file for complete search history.

(56) References Cited

U.S. PATENT DOCUMENTS

| | | | | | |
|---|---|---|---|---|---|
| 5,675,177 | A | * | 10/1997 | Abys et al. | 257/666 |
| 5,684,329 | A | * | 11/1997 | Serizawa | 257/677 |
| 5,728,285 | A | * | 3/1998 | Mathew | 205/182 |
| 5,767,574 | A | * | 6/1998 | Kim et al. | 257/677 |
| 5,882,955 | A | * | 3/1999 | Huang et al. | 438/111 |
| 5,958,607 | A | * | 9/1999 | Kim et al. | 428/675 |
| 6,037,653 | A | * | 3/2000 | Kim et al. | 257/666 |
| 6,362,950 | B1 | * | 3/2002 | Kamigawa et al. | 361/523 |
| 6,388,336 | B1 | * | 5/2002 | Venkateshwaran et al. | 257/779 |
| 6,518,508 | B2 | * | 2/2003 | Park et al. | 174/255 |
| 6,946,324 | B1 | * | 9/2005 | McLellan et al. | 438/111 |
| 2003/0011048 | A1 | * | 1/2003 | Abbott et al. | 257/666 |
| 2004/0262719 | A1 | * | 12/2004 | Seki et al. | 257/666 |

FOREIGN PATENT DOCUMENTS

| | | | |
|---|---|---|---|
| JP | 05090465 A | * | 4/1993 |
| JP | 09291375 A | * | 11/1997 |
| JP | 2002339097 A | * | 11/2002 |

* cited by examiner

*Primary Examiner*—Chris C. Chu
(74) *Attorney, Agent, or Firm*—Yingsheng Tung; Wade James Brady, III; Frederick J. Telecky, Jr.

(57) ABSTRACT

A leadframe with a structure made of a base metal (105), wherein the structure has a plurality of surfaces. On each of these surfaces are metal layers in a stack adherent to the base metal. The stack comprises a nickel layer (201) in contact with the base metal, a palladium layer (202) in contact with the nickel layer, and an outermost tin layer (203) in contact with the palladium layer. In terms of preferred layer thicknesses, the nickel layer is between about 0.5 and 2.0 μm thick, the palladium layer between about 5 and 150 nm thick, and the tin layer less than about 5 nm thick, preferably about 3 nm. At this thinness, the tin has no capability of forming whiskers, but offers superb adhesion to polymeric encapsulation materials, improved characteristics for reliable stitch bonding as well as affinity to reflow metals (solders).

7 Claims, 1 Drawing Sheet

LOW COST LEAD-FREE PREPLATED LEADFRAME HAVING IMPROVED ADHESION AND SOLDERABILITY

FIELD OF THE INVENTION

The present invention is related in general to the field of semiconductor devices and processes, and more specifically to the materials and fabrication of leadframes for semiconductor devices.

DESCRIPTION OF THE RELATED ART

Leadframes for semiconductor devices provide a stable support pad for firmly positioning the semiconductor chip, usually an integrated circuit (IC) chip within a package. Since the leadframe, including the pad, is made of electrically conductive material, the pad may be biased, when needed, to any electrical potential required by the network involving the semiconductor device, especially the ground potential.

In addition, the leadframe offers a plurality of conductive segments to bring various electrical conductors into close proximity of the chip. The remaining gap between the inner end of the segments and the contact pads on the IC surface are bridged connectors, typically thin metallic wires individually bonded to the IC contact pads and the leadframe segments. Consequently, the surface of the inner segment ends has to be suitable for stitch-attaching the connectors.

Also, the ends of the lead segment remote from the IC chip ("outer" ends) need to be electrically and mechanically connected to external circuitry, for instance, to assemble printed circuit boards. In many electronic applications, this attachment is performed by soldering, conventionally with lead-tin (Pb/Sn) eutectic solder at a reflow temperature in the 210 to 220° C. range. Consequently, the surface of the outer segment ends has to have affinity for reflow metals or alloys.

Finally, the leadframe provides the framework for encapsulating the sensitive chip and fragile connecting wires. Encapsulation using plastic materials, rather than metal cans or ceramic, has been the preferred method because of low cost. The transfer molding process for epoxy-based thermoset compounds at 175° C. has been practiced for many years. The temperature of 175° C. for molding and mold curing (polymerization) is compatible with the temperature of 210 to 220° C. for eutectic solder reflow.

Reliability tests in moist environments require that the molding compound have good adhesion to the leadframe and the device parts it encapsulates. Two major contributors to good adhesion are the chemical affinity of the molding compound to the metal of the leadframe and the surface preparation of the leadframe.

The recent general trend to avoid Pb in the electronics industry and use Pb-free solders, pushes the reflow temperature range into the neighborhood of about 260° C. This higher reflow temperature range makes it more difficult to maintain the mold compound adhesion to the leadframes. This is especially true for the very small leadframe surface available in QFN (Quad Flat No-lead) and SON (Small Outline No-lead) devices. For this temperature range, known leadframes do not offer metallization for good adhesion combined with low cost, easy manufacturability, and avoidance of whiskers.

It has been common practice to manufacture single piece leadframes from thin (about 120 to 250 µm) sheets of metal. For reasons of easy manufacturing, the commonly selected starting metals are copper, copper alloys, and iron-nickel alloys (for instance the so-called "Alloy 42"). The desired shape of the leadframe is etched or stamped from the original sheet. In this manner, an individual segment of the leadframe takes the form of a thin metallic strip with its particular geometric shape determined by the design. For most purposes, the length of a typical segment is considerably longer than its width.

SUMMARY OF THE INVENTION

A need has therefore arisen for a low cost, reliable leadframe combining adhesion to molding compounds, bondability for connecting wires, solderability of the exposed leadframe segments, and no risk of tin dendrite growth. There are technical advantages, when the leadframe and its method of fabrication is low cost and flexible enough to be applied for different semiconductor product families and a wide spectrum of design and assembly variations, and achieves improvements toward the goals of improved process yields and device reliability. There are further technical advantages, when these innovations are accomplished using the installed equipment base so that no investment in new manufacturing machines is needed.

One embodiment of the invention is a leadframe with a structure made of a base metal, wherein the structure has a plurality of surfaces. On each of these surfaces are metal layers in a stack adherent to the base metal. The stack comprises a nickel layer in contact with the base metal, a palladium layer in contact with the nickel layer, and an outermost tin layer in contact with the palladium layer.

In terms of preferred layer thicknesses, the nickel layer is between about 0.5 and 2.0 µm thick, the palladium layer between about 5 and 150 nm thick, and the tin layer less than about 5 nm thick, preferably about 3 nm. At this thinness, the tin has no capability of forming whiskers, but offers superb adhesion to polymeric encapsulation materials, improved characteristics for reliable stitch bonding as well as affinity to reflow metals (solders). By replacing the conventional gold layer, the tin layer offers a low cost alternative.

Another embodiment of the invention is a semiconductor device, which has a leadframe with a structure made of a base metal, wherein the structure comprises a chip mount pad and a plurality of lead segments. The base metal has consecutively an adherent nickel layer in contact with the base metal, a palladium layer in contact with the nickel layer, and an outermost tin layer in contact with the palladium layer. A semiconductor chip is attached to the mount pad, and conductive connections tie the chip and the lead segments. Polymeric encapsulation material covers the chip, the connections and portions of the lead segments.

Another embodiment of the invention is a method for fabricating a leadframe, wherein a base metal structure with a plurality of surfaces is provided. A stack of metal layers adherent to the base metal is plated on each of the structure surfaces. This plating step comprises the plating of a nickel layer, thickness between about 0.5 to 2.0 µm, in contact with the base metal; next, the plating of a palladium layer, thickness between about 5 and 150 nm, in contact with the nickel layer; and finally the plating of a tin layer, thickness less than about 5 nm, in contact with the palladium layer. All three plating steps can be performed without masking or selective plating.

It belongs to the technical advantages of the invention that no toxic or whiskering materials are used for the plating steps, down-bonding capability is enhanced, and moisture-level quality is improved. Furthermore, the required plating processes are inexpensive and easy to manufacture.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
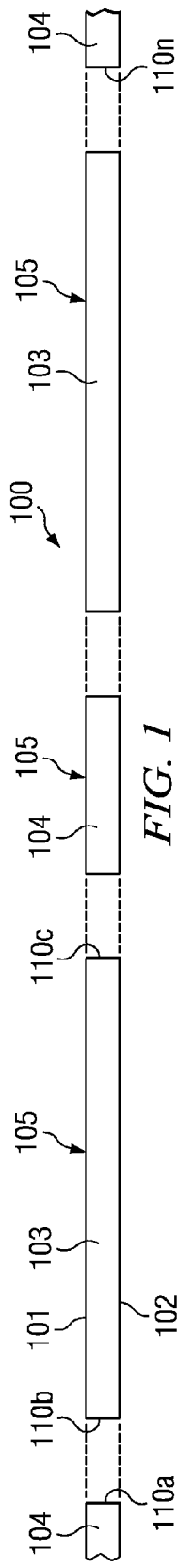
FIG. 1 is a schematic cross section of the base metal structure of a portion of a leadframe strip having formed leadframe structures.

FIG. 1 is a schematic and simplified cross section of a leadframe portion, generally designated 100. The leadframe has a plurality of surfaces: the first surface 101, the second surface 102, and numerous side edge surfaces 110a, 110b . . . 110n. While the surfaces 101 and 102 originate from the sheet of starting material, the side edge surfaces 110a to 110n have been created by the forming process of the leadframe structure. The leadframe portion depicted contains a plurality of chip mount pads 103 and a plurality of lead segments 104. The leadframe is made of a base metal 105.

As defined herein, the starting material of the leadframe is called the "base metal", indicating the type of metal. Consequently, the term "base metal" is not to be construed in an electrochemical sense (as in opposition to 'noble metal') or in a structural sense.

Base metal 105 is typically copper or a copper alloy. Other choices comprise brass, aluminum, iron-nickel alloys ("Alloy 42"), and Kovar.

Base metal 105 originates with a metal sheet in the preferred thickness range from 100 to 300 µm; thinner sheets are possible. The ductility in this thickness range provides the 5 to 15% elongation that facilitates the segment bending and forming operation needed for some of the finished devices. The leadframe parts such as chip mount pads, lead segments, connecting rails (not shown in FIG. 1, but hinted at by dashed lines) are stamped or etched from the starting metal sheet. As stated, these stamping or etching processes create numerous side edges 110a, 110b . . . 110n, of the leadframe parts.

Figure 2:
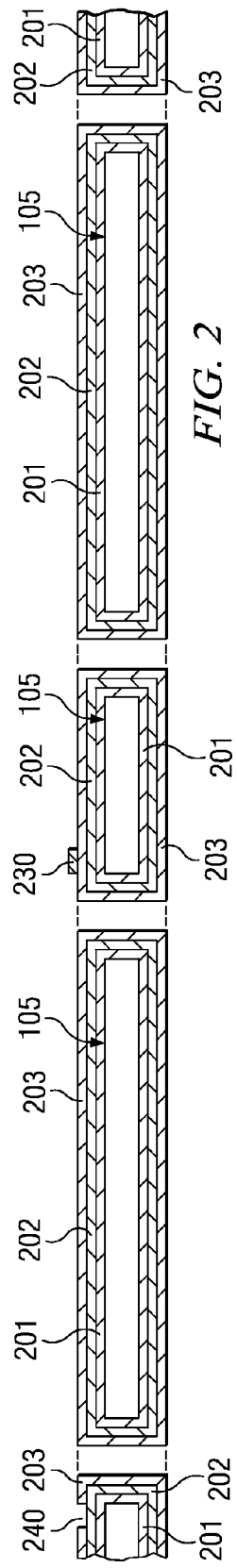
FIG. 2 illustrates a schematic cross section of a leadframe strip portion with a base metal structure and a plurality of surfaces, wherein the surfaces have been plated with a stack of adherent layers according to the invention.

FIG. 2 illustrates a schematic cross section of a leadframe according to an embodiment of the invention. The leadframe structure has a base metal 105 with a plurality of surfaces, which were created by the process of stamping or etching. A stack of metal layers adheres to each of the structure surfaces. The stack comprises: A nickel layer 201 in contact with base metal 105; the preferred thickness range of the nickel layer is between about 0.5 and 2.0 µm. Next, a palladium layer 202 is in contact with the nickel layer; the preferred thickness range of the palladium layer is between about 5 and 150 nm. Finally, the outermost layer 203 is a thin tin layer in contact with the palladium layer; the preferred thickness of the tin layer is less than 5 nm, most preferably about 3 nm. The outermost thin tin enhances the adhesion to polymeric encapsulants such as polyimides and epoxies significantly; for some molding compounds, an adhesion improved by a factor of 15 compared to the conventionally often used gold layer has been measured. In addition, the tin layer supports the affinity of the palladium to reflow metals such as solders (preferably tin and tin alloys such tin/silver/copper). Furthermore, the thinness of the tin layer allows reliable wire stitch bonding (for instance, gold wires) to the palladium, and has no potential for growing whiskers because of its thinness.

Since all these metal layers cover the leadframe surfaces uniformly, the layer deposition is preferably achieved by plating the whole leadframe strip (see below) and masking can be avoided. However, if some devices require a tin layer with a plurality of windows in selected areas in order to expose the underlying palladium for special metal bonding, then the tin layer has to be plated with a mask applied to leadframe surface 101. An example of a resulting window is designated 240 in FIG. 2.

In another embodiment, some wire stitch bonding may need an additional silver layer over the tin layer in selected areas. In this case, the silver has to be plated using a mask (see below). An example of a resulting selected silver spot is designated 230 in FIG. 2.

Figure 3:
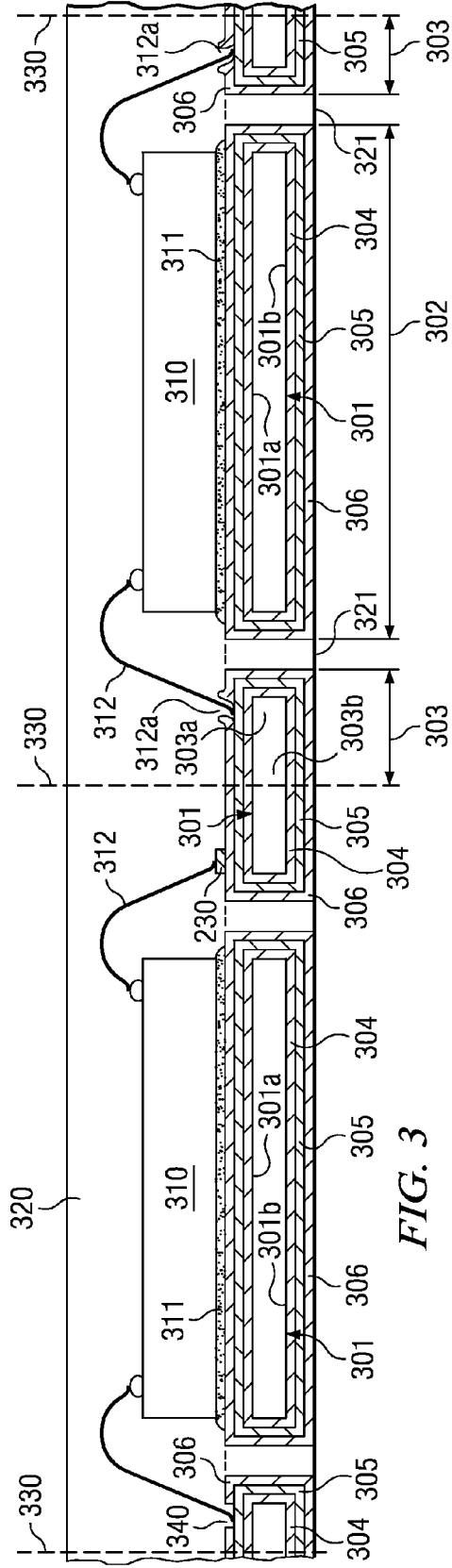
FIG. 3 illustrates a device embodiment of the invention; the schematic cross section shows a portion of a leadframe strip, prepared according to an embodiment of the invention, and a plurality of semiconductor chips assembled and encapsulated on one leadframe surface.

Another embodiment of the invention is a semiconductor device, as exemplified by the Quad Flat No-leads (QFN) or Small Outline No-leads (SON) device in FIG. 3. Actually, FIG. 3 shows a leadframe strip with a plurality of assembled and packaged devices before singulation. In the embodiment of the invention, the device has a leadframe with a base metal 301 and a first surface 301a and a second surface 301b. An example for the base metal is copper. Furthermore, the leadframe is structured into a chip mount pad 302 and a plurality of lead segments 303. Each lead segment has a first end 303a near chip mount pad 302, and a second end 303b remote from mount pad 302.

The first leadframe surface 301a, the second leadframe surface 301b, and all side edges are covered by a stack of layers, which provides for the leadframe reliable adhesion to polymeric materials as well as affinity to reflow metals. The stack of layers comprises a nickel layer 304 in contact with the base metal, a palladium layer 305 in contact with the nickel layer, and an outermost tin layer 306 in contact with the palladium layer.

A semiconductor chip 310, for example an integrated circuit chip, is attached by means of an adhesive layer 311 to each chip mount pad 302. Bonding wires 312 interconnect chip 310 with the first ends 303a of the lead segments 303. The stitch bond 312a is welded to the outermost tin layer 306, where it typically breaks through the thin layer and is actually attached to the palladium layer 305. In some embodiments, selective silver areas 230 support the stitch attachments of wires 312. In other embodiments, it is advisable to leave windows 340 in the outermost tin layer 306 for the stitch attachments to the palladium layer 305.

Polymeric encapsulation material 320, for example epoxy-based molding compound, covers chip 310, bonding wires 312 and first ends 303a of the lead segments. The polymeric material 320 also fills the gaps between chip 310 and the first ends of the lead segments and thus covers the leadframe side edges. Consequently, polymeric material 320 also forms a surface 321 in the same plane as the outermost surface layer 306.

Reflow metals may cover some portions, or all, of the second leadframe surface. As an example, a tin alloy may cover at least the second ends of the lead segments, or alternatively all of the lead segments and the exposed outer chip pad surface.

In FIG. 3, dashed lines 330 indicate the locations, where a saw will cut the completed leadframe strip into individual devices. The saw is cutting through encapsulation material 320 as well as through the leadframe segments.

Another embodiment of the invention is a method for fabricating a leadframe, which starts with the step of providing a base metal structure with a plurality of surfaces and continues with the steps of plating metal layers on these surfaces. The sequence of the consecutive plating steps is:

Plating a layer of nickel on the base metal in the thickness range from about 0.5 to 2.0 µm.

Plating a layer of palladium on the nickel layer in the thickness range from about 5 to 150 nm.

Plating a layer of tin on the palladium layer in the thickness range from about 5 to 2 nm.

Some embodiments of the invention require selective plating. Examples of these embodiments are devices, which require an additional silver layer over the tin layer in selected areas; or devices, which require windows in the tin layer so that the underlying palladium is exposed. Whenever the methods described above require a selective metal deposition of a layer onto the leadframe, an inexpensive, temporary masking step is used, which leaves only those leadframe portions exposed which are intended to receive the metal layer. Because of the fast plating time, conventional selective spot plating techniques can be considered, especially reusable rubber masks. For thin metal plating, a wheel system is preferred.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium arsenide, or any other semiconductor or compound material used in integrated circuit manufacturing.

As another example, the process step of stamping the leadframes from a sheet of base metal may be followed by a process step of selective etching, especially of the exposed base metal surfaces in order to create large-area contoured surfaces for improved adhesion to molding compounds. The sequence of plated layers according to the invention can accommodate any such specially etched leadframe base structures.

It is therefore intended that the appended claims encompass any such modifications or embodiment.

I claim:

1. A method for fabricating a leadframe comprising the steps of:
   providing a structured base metal strip having a plurality of surfaces; and
   plating a stack of metal layers adherent to said base metal on each of said structured surfaces, said step comprising consecutively:
   plating a nickel layer covering substantially said base metal;
   plating a palladium layer covering substantially said nickel layer; and
   plating an outermost tin layer penetrable during a stitch-bonding operation, covering substantially said palladium layer.

2. The leadframe according to claim 1 wherein said nickel layer has a thickness between about 0.5 and 2.0 µm.

3. The method according to claim 1 wherein said palladium layer has a thickness between about 5 and 150 nm.

4. The method according to claim 1 wherein said tin layer has a thickness less than about 5 nm.

5. The method according to claim 1 wherein said tin layer has a thickness of about 3 nm.

6. The method according to claim 1 further comprising the step of plating said tin layer so that it leaves selected windows open to the underlying palladium layer.

7. The method according to claim 1 further comprising the step of selectively plating a layer of silver in contact with said tin layer.

* * * * *